United States Patent
Ahn et al.

(10) Patent No.: US 6,423,629 B1
(45) Date of Patent: Jul. 23, 2002

(54) MULTILEVEL COPPER INTERCONNECTS WITH LOW-K DIELECTRICS AND AIR GAPS

(76) Inventors: Kie Y. Ahn, 639 Quaker St., Chappaqua, NY (US) 10514; Leonard Forbes, 965 NW. Highland Ter., Corvallis, OR (US) 97330

(*) Notice: Subject to any disclaimer, the term of this patent is extended or adjusted under 35 U.S.C. 154(b) by 0 days.

(21) Appl. No.: 09/583,514

(22) Filed: May 31, 2000

(51) Int. Cl.$^7$ .......................................... H01L 21/4763
(52) U.S. Cl. ....................................... 438/622; 438/619
(58) Field of Search ............................. 438/618, 619, 438/622, 623, 626, 631, 633, 675, 680, 702, 421, 422, 624, 686

(56) References Cited

U.S. PATENT DOCUMENTS

| | | | |
|---|---|---|---|
| 5,356,672 A | 10/1994 | Schmitt, III et al. | 427/446 |
| 5,792,706 A | * 8/1998 | Michael et al. | 438/626 |
| 5,900,668 A | 5/1999 | Wollesen | 257/522 |
| 6,140,456 A | * 10/2000 | Lee et al. | 528/196 |
| 6,159,842 A | * 12/2000 | Chang et al. | 438/622 |
| 6,214,719 B1 | * 4/2001 | Nag | 438/619 |
| 6,218,282 B1 | * 4/2001 | Buynoski | 438/619 |

OTHER PUBLICATIONS

Fleming, J.G., et al., "Use Of Air Gap Structures To Lower Level Intralevel Capacitance", *Proceedings of the 1997 Dielectrics for ULSI Multi–level Interconnect Conference*, p. 140, (1997).

Grill, A., et al., "Low dielectric constant films prepared by plasma–enhanced chemical vapor deposition from tetramethvisilane", *Journal of Applied Physics*, 85(6), pp. 3314–3318, (1999).

Hymes, S., et al., "Passivation of Copper by Silicide Formation in Dilute Silane", *Conference Proceedings ULSI–VII*, pp. 425–431, (1992).

Quan, Y.C., et al., "Polymer–like Organic Thin Films Deposited by Plasma Enhanced Chemical Vapor Deposition Using the Para–xylene Precursor as Low Dielectric Constant Interlayer Dielectrics for Multilevel Metallization", *Jpn. J. Appl. Phys*, 38, pp. 1356–1358, (1999).

Shieh, B., et al., "Air–Gap Formation During IMD Deposition to Lower Interconnect Capacitance", *IEEE Electron Device Letters*, 19(1), pp. 16–18, (1998).

Uchida, Y., et al., "A Flourinated Organic–Silica Film with Extremely Low Dielectric Constant", *Jpn. J. Appl. Phys.*, 38, pp. 2368–2372, (Apr. 1999).

Ueda, T., et al., "A novel Air Gap Integration Scheme for Multi–level Interconnects using Self–aligned Via Plugs", *Symposium on VLSI Technology Digest of Technical Papers*, pp. 46–47, (1998).

* cited by examiner

Primary Examiner—David Nelms
Assistant Examiner—Phuc T. Dang

(57) ABSTRACT

Structures and methods are provided for an improved multilevel wiring interconnect in an integrated circuit assembly. The present invention provides for a multilayer copper wiring structure by electroless, selectively deposited copper in a streamlined process which further reduces both intralevel line to line capacitance and the inter-level capacitance.

In particular, an illustrative embodiment of the present invention includes a novel methodology for forming multilevel wiring interconnects in an integrated circuit assembly. The method includes forming a number of multilayer metal lines, e.g. copper lines formed by selective electroless plating, separated by air gaps above a substrate. A low dielectric constant material is deposited between the number of metal lines and the substrate using a directional process. According to the teachings of the present invention, using a directional process includes maintaining a number of air gaps in the low dielectric constant material. Structures and systems are similarly included in the present invention.

31 Claims, 5 Drawing Sheets

MULTILEVEL COPPER INTERCONNECTS WITH LOW-K DIELECTRICS AND AIR GAPS

RELATED APPLICATIONS

This application is related to the following co-pending and commonly assigned application; application Ser. No. 09/483881, entitled "Selective Electroless-Plated Copper Metallization," which is hereby incorporated by reference.

FIELD OF THE INVENTION

The present invention relates generally to integrated circuits. More particularly, it pertains to structures and methods for multilevel copper interconnects with low-k dielectric constants and air gaps.

BACKGROUND OF THE INVENTION

As the integrated circuit (IC) technology makes rapid progress toward 100 nm gate transistors, the speed limiting factor is no longer the transistor delay, but the RC delay associated with the metal interconnects. A great deal of work is being done in this area on new and innovative materials and fabrication techniques to reduce the capacitance and thus reduce RC delay of interconnects. Currently studied low-k dielectrics include fluorinated silicon dioxide ($SiO_2$), aerogels, and polymers. Additionally, as IC technology continues to scale, the aspect ratio of metal lines increases and the intra-level line-to-line capacitance increasingly dominates over the inter-level capacitance. Thus, it becomes increasingly important to implement low-k schemes between tightly spaced metal lines and less so between metal levels.

One approach to reducing the RC delay is provided in copending and commonly assigned application; application Ser. No. 09/483881, entitled "Selective Electroless-Plated Copper Metallization," which is hereby incorporated by reference. Further, an article by B. Shieh et al., entitled "Air-Gap Formation During IMD Deposition to Lower Interconnect Capacitance," *IEEE Electron Devices Letters,* 19, no. 1, p. 16–18 (1998) presented simulations and some initial experimental results showing the possible capacitance reduction achievable using air-gap structures.

Another approach is described in an article by T. Ueda et al., entitled "A Novel Air Gap Integration Scheme for Multi-level Interconnects using Self-aligned Via Plugs," 1998 Symposium on VLSI Technology, *Digest of Technical Papers,* p. 46–47 (1998) in which an air-gap structure was introduced between lines and $SiO_2$ was provided between metal levels. As described in this article, an effective dielectric constant of 1.8 at 0.3 micrometer ($\mu$m) line spacing was obtained. The authors of this article used the combination of PE-CVD $SiO_2$ with poor step coverage characteristics to intentionally form the air gaps, and biased HDP-CVD $SiO_2$ with good filling capability for the formation of inter-metal dielectric (IMD). In another approach described by J. G. Fleming et al., entitled "Use of Air Gap Structures to Lower Intra-level Capacitance," *Proceedings of* 1997 *Dielectrics for ULSI Multi-level Interconnect Conference,* p. 139 (1997) a process of fabricating air-gap structures to lower intra-level capacitance was introduced. The authors of this article used an oxide deposition process with poor step coverage to create the desired air gaps. Yet another approach is described in U.S. Pat. No. 5,900,668, by D. L. Wollesen, entitled "Low Capacitance Interconnection," issued May 4, 1999, which describes a scheme in which the parasitic capacitance is reduced by removing sections of dielectric inter-layers by anisotropic etching to form air-gaps which can remain or be filled with another dielectric material with a lower dielectric constant. An example of a prior art multilevel metallization scheme according to this process is provided in FIG. 1.

Still, all of these approaches either involve complex additional processing steps or fail to provide an added benefit of reducing both intral-level line to line capacitance and the inter-level capacitance. Accordingly, there remains a need in the art to provide streamlined, improved methods and structures for alleviating the capacitance problems associated with via and metal line fabrication processes as design rules shrink.

SUMMARY OF THE INVENTION

The above mentioned problems associated with integrated circuit size and performance, the via and metal line formation process, and other problems are addressed by the present invention and will be understood by reading and studying the following specification. Structures and methods are provided which include a selective electroless copper metallization. The present invention provides for a multi-layer copper wiring structure by electroless, selectively deposited copper in a streamlined process which further reduces both intra-level line to line capacitance and the inter-level capacitance.

In particular, an illustrative embodiment of the present invention includes a novel methodology for forming multi-level wiring interconnects in an integrated circuit assembly. The method includes forming a number of multilayer metal lines, e.g. copper lines formed by selective electroless plating, separated by air gaps above a substrate. A low dielectric constant material is deposited between the number of metal lines and the substrate using a directional process. According to the teachings of the present invention, using a directional process includes maintaining a number of air gaps in the low dielectric constant material.

In one embodiment, depositing a low dielectric constant material includes depositing an organic silica film. In one embodiment, depositing a low dielectric constant material between the number of metal lines and the substrate using a directional process includes using a microwave plasma-assisted supersonic jet deposition process. In another, depositing a low dielectric constant material between the number of metal lines and the substrate using a directional process includes using a quasi hydrogen-free chemical vapor deposition process. In another, depositing a low dielectric constant material includes forming a low dielectric constant film by radio frequency plasma enhanced chemical vapor deposition using tetramethylsilane. In still another, depositing a low dielectric constant material includes depositing a polymer-like organic thin film by plasma-enhance chemical vapor deposition using a para-xylene precursor.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

BRIEF DESCRIPTION OF THE DRAWINGS

The following detailed description of the preferred embodiments can best be understood when read in conjunction with the following drawings, in which.

DETAILED DESCRIPTION

In the following detailed description of the invention, reference is made to the accompanying drawings which form a part hereof, and in which is shown, by way of illustration, specific embodiments in which the invention may be practiced. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Substrate includes doped and undoped semiconductors, epitaxial semiconductor layers supported by a base semiconductor or insulator, as well as other semiconductor structures well known to one skilled in the art. The term insulator is defined to include any material that is less electrically conductive than the materials generally referred to as conductors by those skilled in the art. The following detailed description is, therefore, not to be taken in a limiting sense.

Figure 1:
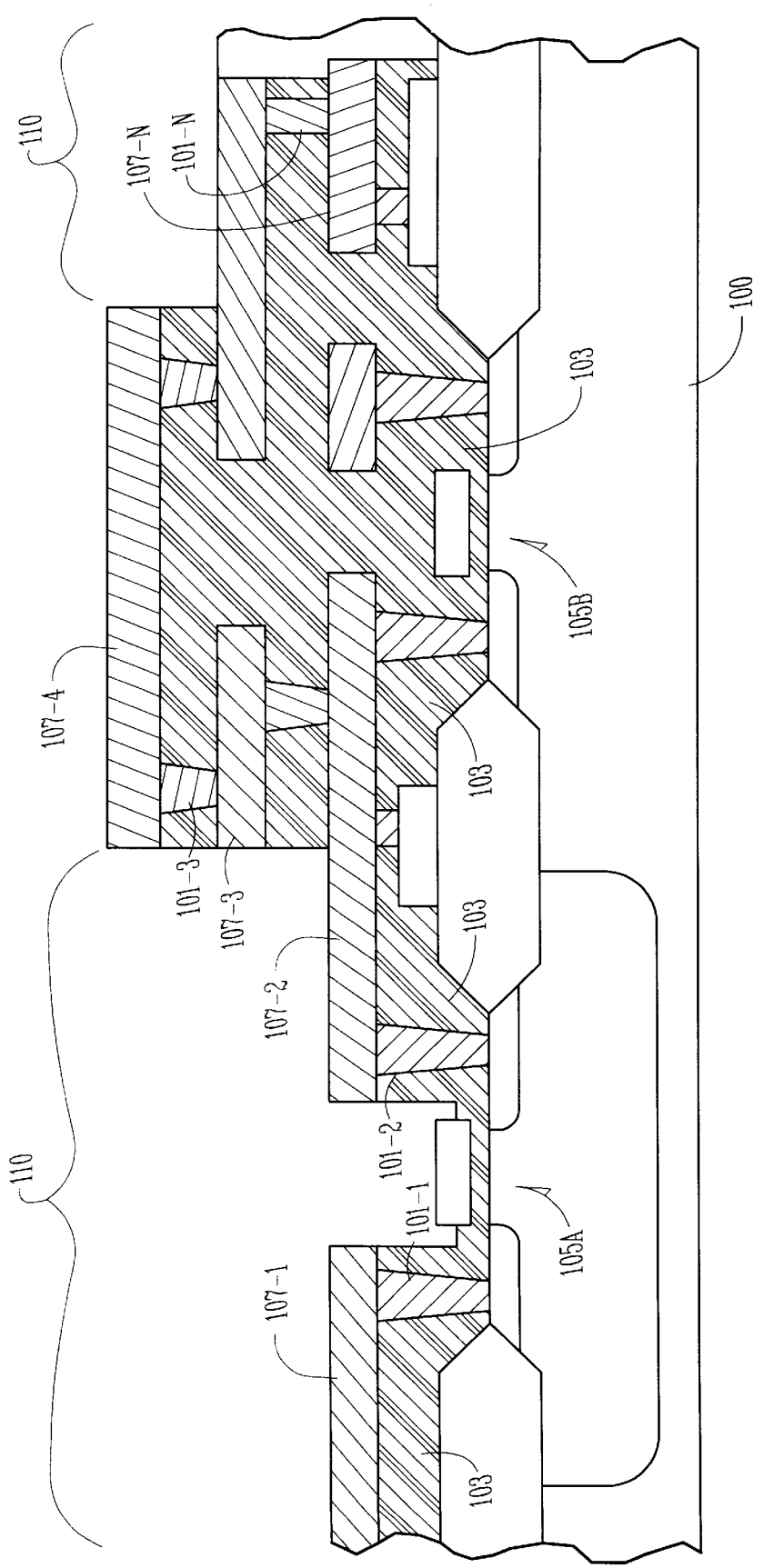
FIG. 1 illustrates a multilevel wiring interconnect scheme according to the teachings of the prior art.

The prior art in FIG. 1, shows a number of vias 101-1, 101-2, 101-3, . . . , 101-N are formed in an insulator material 103, e.g. silicon dioxide ($SiO_2$), contacting with a substrate 100. As one of ordinary skill in the art will recognize, any number of semiconductor devices, e.g. 105A and 105B, can be formed in the substrate to which the number of vias 101-1, 101-2, 101-3, . . . , 101-N make electrical contact. Also, as shown in FIG. 1, a number of metal lines 107-1, 107-2, 107-3, . . . , 107-N are sandwiched and electrically couple between the number of vias 101-1, 101-2, 101-3, . . . , 101-N in order to form a multilevel wiring interconnect.

Conventionally, to form vias and aluminum wire metal lines, fabricators use a dual-damascene metallization technique, which takes its name from the ancient Damascene metalworking art of inlaying metal in grooves or channels to form ornamental patterns. The dual-damascene technique entails covering the components on a wafer with an insulative layer 103, etching small holes in the insulative layer 103 to expose portions of the components underneath in substrate 100, and subsequently etching shallow trenches from hole to hole to define a number of metal lines. Fabricators then blanket the entire insulative layer with a layer of aluminum or other conductive material and polish off the excess, leaving behind conductive vias, or contact plugs, in the holes and conductive lines in the trenches.

As shown in the prior art of FIG. 1, a metal conductive material such as Aluminum can be deposited in the openings of in the insulator 103 using an electroplated metal deposition technique. As shown in FIG. 1, the metal conductive material, e.g. the number of vias 101-1, 101-2, 101-3, . . . , 101-N and the number of metal lines 107-1, 107-2, 107-3, . . . , 107-N, fills the holes and the trenches.

FIG. 1 illustrates the structure after the excess metal conductive material has been removed through a chemically mechanical planarization (CMP) process step. In FIG. 1, additional etching steps have been performed to create air gaps in certain regions such as regions 110. One of ordinary skill in the art will understand, upon viewing the structure of FIG. 1, the limits on the ability to form air gaps between the intra-level line to line spacing as well as the limits on the ability to form inter-level air gaps according to this prior art method.

The purpose of this invention is to disclose a simple method of fabricating a multi-level interconnect with copper to reduce resistance and a combination of air-gaps and low dielectric constant insulators, e.g. low-k dielectrics, to reduce capacitance. According to one embodiment of the present invention, a selective copper deposition by electroless deposition at or near room temperature is used, as disclosed by K. Y. Ahn and Leonard Forbes in copending and commonly assigned application Ser. No. 09/483881, entitled "Selective Electroless-Plated Copper Metallization," which is hereby incorporated by reference.

Figure 2A:
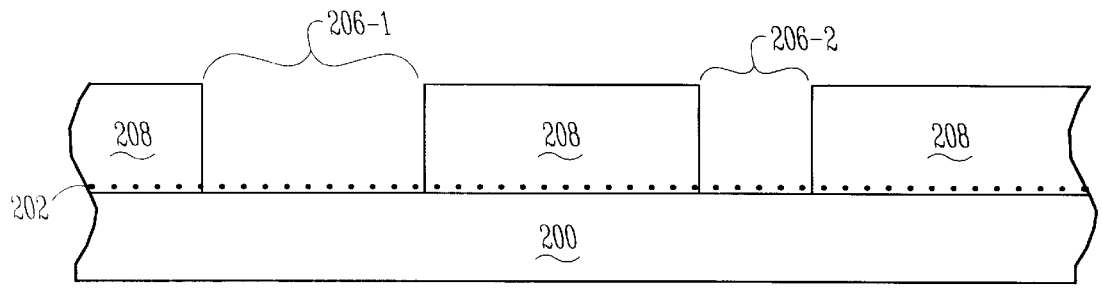
FIGS. 2A–2F illustrate an embodiment of the various processing steps for a selective electroless-plated copper metallization and multilevel wiring interconnect scheme according to the teachings of the present invention.

FIGS. 2A–2E illustrate an embodiment of the various processing steps for a selective electroless-plated copper metallization and multilevel wiring interconnect scheme according to the teachings of the present invention. As shown in FIGS. 2A, a seed layer, or first seed layer, 202 is deposited on a substrate 200. In one embodiment, depositing the first seed layer 202 on the substrate 200 includes depositing a thin film of Palladium (Pd) on the substrate 200. In another embodiment, depositing the first seed layer 202 on the substrate 200 includes depositing a thin film of Copper (Cu) on the substrate. In one embodiment, the seed layer 202 is deposited to have a thickness of less than 15 nanometers (nm). In one embodiment, the seed layer 202 is deposited to form a barely continuous film in the thickness range of 3 to 10 nm. In another embodiment, the seed layer 202 is deposited such that the seed layer possesses a discontinuous island structure in the thickness range of 3 to 10 nm. In one embodiment, the seed layer 202 is deposited using a physical vapor deposition process. For example, in one embodiment, the seed layer 202 is deposited using a sputtering deposition technique. In another embodiment, the seed layer 202 is deposited using an evaporation deposition technique. One of ordinary skill in the art will understand, upon reading this disclosure, the manner in which such physical vapor deposition processes can be performed to form the seed layer 202 described herein.

A photolithography technique is used to define a number of via holes, conductor openings, e.g. openings 206-1 and 206-2, above the seed layer 202 on the substrate 200. As one of ordinary skill in the art will understand upon reading this disclosure, using a photolithography technique to define a number of holes 206-1 and 206-2, includes patterning a photoresist layer 208 to define the number via holes, or openings 206-1 and 206-2 over the seed layer 202. One of ordinary skill in the art will also understand upon reading this disclosure, the manner of forming the patterned photoresist layer, or first patterned photoresist layer, 208. For example, a photoresist layer can be deposited over the seed layer 202 using any suitable technique, e.g. by spin coating. Then the photoresist can be masked, exposed, and washed to define the number of via holes, or openings 206-1 and 206-2 to the seed layer 202. One of ordinary skill in the art will further understand, upon reading this disclosure, that the thickness of the photoresist layer 202 is scalable. That is, the deposition of the photoresist layer 208 is controllable such that the photoresist thickness can be set at a predetermined height (h1). Thus, the scalable thickness of the photoresist layer 208 determines a height (h1), or depth (h1) for the number of via holes, or openings 206-1 and 206-2. The structure is now as shown in FIG. 2A.

Figure 2B:
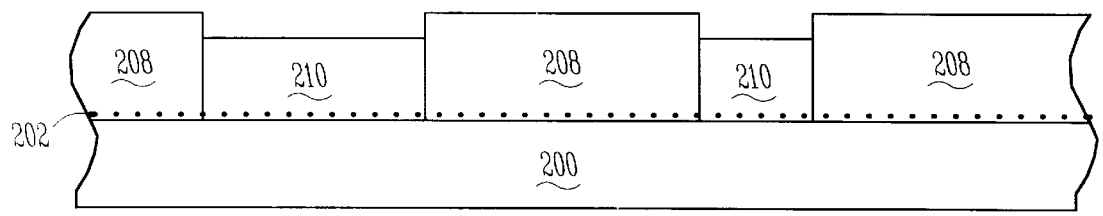

FIG. 2B illustrates the structure after the next sequence of processing steps. In FIG. 2B, a first conductive metal layer is deposited over the structure. One of ordinary skill in the art will understand upon reading this disclosure that the invention is equally applicable for forming multilevel wiring interconnect structures using conductive metal lines and vias other than copper, such as, aluminum, gold and silver. However, for convenience, the fabrication step discussed herein are focused on using copper for the metal lines and vias. Thus, as shown in FIG. 2B, a layer of copper, first layer of copper, or first level of copper vias 210 is deposited over the seed layer 202 using electroless plating. In an alternative embodiment, the first layer of copper can be a first level of copper metal lines 210. The invention is not so limited. One of ordinary skill in the art will understand upon reading this disclosure the various manner in which the layer of copper, first layer of copper, or first level of copper vias 210 can be deposited over the seed layer 202 using electroless plating. According to the teachings of the present invention, the layer of copper, first layer of copper, or first level of copper vias 210 is formed in the number of via holes, or openings, 206-1 and 206-2. According to the teachings of the present invention depositing the layer of copper, first layer of copper, or first level of copper vias 210 over the seed layer 202 is such that the layer of copper, first layer of copper, or first level of copper vias 210 form on the seed layer 202 but not on the patterned photoresist layer 208. The structure is now as appears in FIG. 2B.

Figure 2C:
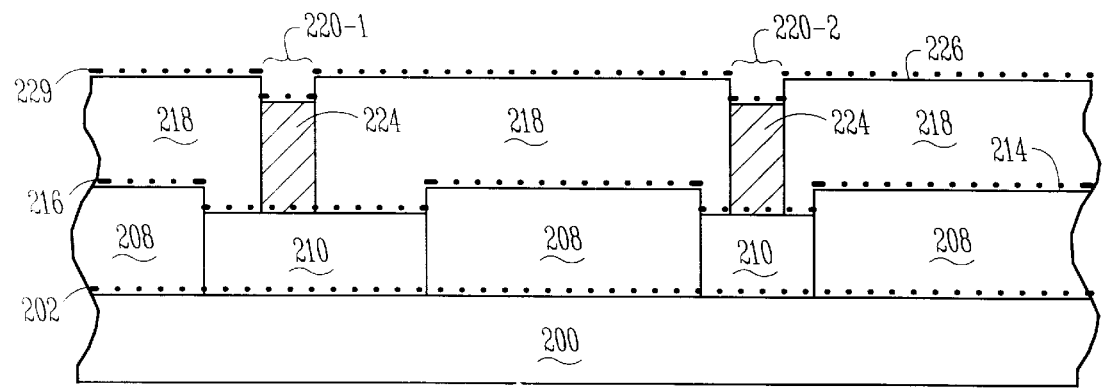

FIG. 2C illustrates the structure following the next sequence of processing steps. In FIG. 2C, another seed layer, or second seed layer, 216 is deposited on the first layer of copper, or first level of copper vias 210 and the top surface 214 of the first patterned photoresist layer 208. In one embodiment, depositing the second seed layer 216 on the first layer of copper, or first level of copper vias 210 and the top surface 214 of the first patterned photoresist layer 208 includes depositing a thin film of Palladium (Pd). In another embodiment, depositing the second seed layer 216 on the first layer of copper, or first level of copper vias 210 and the top surface 214 of the first patterned photoresist layer 208 includes depositing a thin film of Copper (Cu). Again in one embodiment, the second seed layer 216 is deposited to have a thickness of less than 15 nanometers (nm). In one embodiment, the second seed layer 216 is deposited to form a barely continuous film in the thickness range of 3 to 10 nm. In another embodiment, the second seed layer 216 is deposited such that the second seed layer 216 possesses a discontinuous island structure 216 having an island thickness in the range of 3 to 10 nm.

In one embodiment, the second seed layer 216 is deposited using a physical vapor deposition process. For example, in one embodiment, the second seed layer 216 is deposited using a sputtering deposition technique. In another embodiment, the second seed layer 216 is deposited using an evaporation deposition technique. One of ordinary skill in the art will understand, upon reading this disclosure, the manner in which such physical vapor deposition processes can be performed to form the second seed layer 216 described herein.

A second patterned photoresist layer 218 is deposited above the second seed layer 216, which defines a number of conductor line openings, e.g. conductor line openings 220-1 and 220-2. In one embodiment, depositing the second patterned photoresist layer 218 which defines a number of conductor line openings 220-1 and 220-2, or first level metal line openings. In one embodiment, the number of conductor line openings 220-1 and 220-2 are defined to form a number of conductor line openings 220-1 and 220-2 having a near minimum width and spacing. As one of ordinary skill in the art will understand upon reading this disclosure, this insures a sufficient space in the structure for a subsequent removal of the photoresist layers, e.g. first patterned photoresist layer 208, on lower levels. This consideration is also discussed in copending and commonly assigned application; application Ser. No. 09/483881, entitled "Selective Electroless-Plated Copper Metallization," which is hereby incorporated by reference. One of ordinary skill in the art will understand upon reading this disclosure, the manner of forming the second patterned photoresist layer 218. For example, a photoresist layer can be deposited over the second seed layer 216 using any suitable technique, e.g. by spin coating. Then the photoresist can be masked, exposed, and washed to define the number of conductor line openings 220-1 and 220-2 to the second seed layer 216. One of ordinary skill in the art will further understand, upon reading this disclosure, that the thickness of the second patterned photoresist layer 218 is scalable. That is, the deposition of the photoresist layer 218 is controllable such that the photoresist thickness can be set at a predetermined height (h2). Thus, the scalable thickness of the second patterned photoresist layer 218 determines a height (h2), or depth (h2) for the number of conductor line openings 220-1 and 220-2.

As shown in FIG. 2C, another layer of copper, second layer of copper, or first level of conductor lines 224 is deposited or formed in the number of conductor line openings 220-1 and 220-2 using electroless plating. One of ordinary skill in the art will understand upon reading this disclosure the various manner in which this next layer of copper, second layer of copper, or first level of conductor lines 224 can be deposited in the number of conductor line openings 220-1 and 220-2 using electroless plating. According to the teachings of the present invention depositing this next layer of copper, second layer of copper, or first level of conductor lines 224 over the second seed layer 216 is such that this next layer of copper, second layer of copper, or first level of conductor lines 224 form on the second seed layer 216 but not on the second patterned photoresist layer 218. The structure is now as appears in FIG. 2C.

Next, as shown in FIG. 2C, another seed layer, or third seed layer, 229 is deposited on the second layer of copper, or first level of conductor lines 224 and the top surface 226 of the second patterned photoresist layer 218. In one embodiment, depositing the third seed layer 229 on the second layer of copper, or first level of conductor lines 224 and the top surface 226 of the second patterned photoresist layer 218 includes depositing a thin film of Palladium (Pd). In another embodiment, depositing the third seed layer 229 on the second layer of copper, or first level of conductor lines 224 and the top surface 226 of the second patterned photoresist layer 218 includes depositing a thin film of Copper (Cu). Again in one embodiment, the third seed layer 229 is deposited to have a thickness of less than 15 nanometers (nm). In one embodiment, the third seed layer 229 is deposited to form a barely continuous film in the thickness range of 3 to 10 nm. In another embodiment, the third seed layer 229 is deposited such that the third seed layer 229 possesses a discontinuous island structure 229 having an island thickness in the range of 3 to 10 nm.

In one embodiment, the third seed layer 229 is deposited using a physical vapor deposition process. For example, in one embodiment, the third seed layer 229 is deposited using a sputtering deposition technique. In another embodiment, the third seed layer 229 is deposited using an evaporation deposition technique. One of ordinary skill in the art will understand, upon reading this disclosure, the manner in which such physical vapor deposition processes can be performed to form the third seed layer 229 described herein.

Figure 2D:
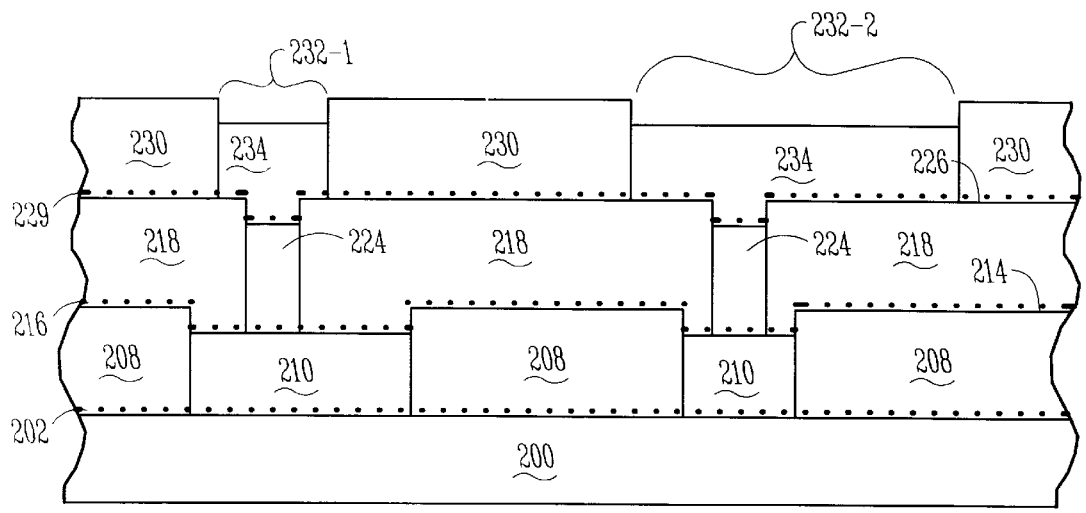

FIG. 2D illustrates the structure following the next sequence of processing steps. In FIG. 2D, a third patterned photoresist layer 230 is deposited above the third seed layer 229, which defines a number of via holes, or openings, e.g. openings 232-1 and 232-2, to the third seed layer 229. One of ordinary skill in the art will understand upon reading this disclosure, the manner of forming the third patterned photoresist layer 230. For example, a photoresist layer can be deposited over the third seed layer 229 using any suitable technique, e.g. by spin coating. Then the photoresist can be masked, exposed, and washed to define the number of via holes, or openings 232-1 and 232-2 to the third seed layer 229. One of ordinary skill in the art will further understand, upon reading this disclosure, that the thickness of the second patterned photoresist layer 218 is scalable. That is, the deposition of the photoresist layer 230 is controllable such that the photoresist thickness can be set at a predetermined height (h3). Thus, the scalable thickness of the second patterned photoresist layer 230 determines a height (h3) for the number of via holes, or openings 232-1 and 232-2.

In FIG. 2D, another layer of copper, third layer of copper, or second level of copper vias 234 is deposited or formed over the third seed layer 229 using electroless plating. One of ordinary skill in the art will understand upon reading this disclosure the various manner in which the third layer of copper, or second level of copper vias 234 can be deposited over the third seed layer 229 using electroless plating. According to the teachings of the present invention, the third layer of copper, or second level of copper vias 234 is formed in the number of via holes, or openings 232-1 and 232-2 to the third seed layer 229. Forming the third layer of copper, or second level of copper vias 234 includes filling the number of via holes, or openings 232-1 and 232-2. According to the teachings of the present invention, depositing third layer of copper, or second level of copper vias 234 over the third seed layer 229 is such that the third layer of copper, or second level of copper vias 234 form on the third seed layer 229 but not on the third patterned photoresist layer 230. The structure is now as appears in FIG. 2D.

Figure 2E:
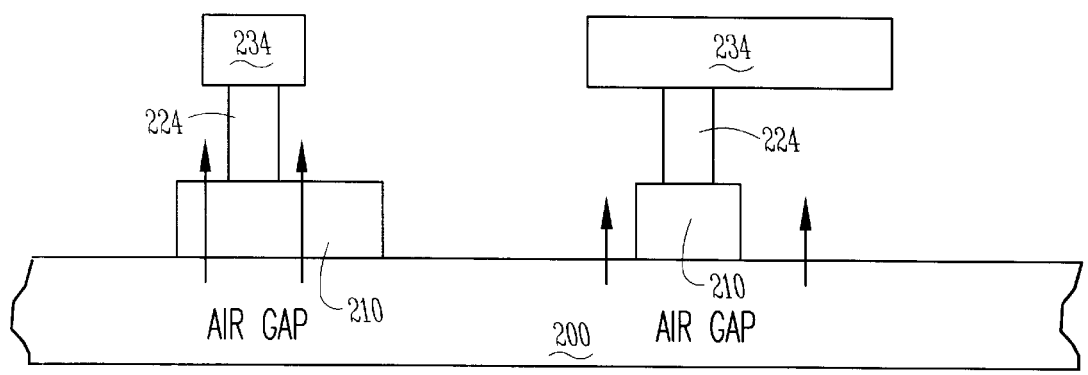

FIG. 2E illustrates the structure following the next sequence of processing steps. In FIG. 2E, the first, second, and third patterned photoresist layers 208, 218, and 230 are removed. In one embodiment, removing the first, second, and third patterned photoresist layers 208, 218, and 230 includes removing the first, second, and third patterned photoresist layers 208, 218, and 230 using an oxygen plasma etching. According to the teachings of the present invention, the method further includes removing the first, second, and third seed layers, 202, 216, and 229 respectively, with the photoresist layers from areas on the substrate which are not beneath the number of copper vias or between the conductive metal lines and the vias. As one of ordinary skill in the art will understand from reading this disclosure, this is due to the present invention's novel methodology where the seed layers, 202, 216, and 229, can be deposited to have a thickness of less than 15 nanometers (nm), thus forming a barely continuous thin film and/or discontinuous island structure. Other suitable techniques for removing the first, second, and third patterned photoresist layers 208, 218, and 230 can similarly be employed, such as soaking in a solvent bath. As one of ordinary skill in the art will further understand upon reading this disclosure, the first, second, and third patterned photoresist layers 208, 218, and 230 can be removed at earlier or later stages of a fabrication process, as described herein, depending on the number of via and metal levels to be formed. It should be noted that a planarization process such as chemical mechanical polishing (CMP) can be employed after each level of metal deposition, if required, to provide a planar surface for the subsequent processing. The structure is now as appears in FIG. 2E, consisting of a number of mulitlayer metal lines, e.g. 210, 224, and 234, separated by air gaps a above a substrate 200.

Figure 2F:
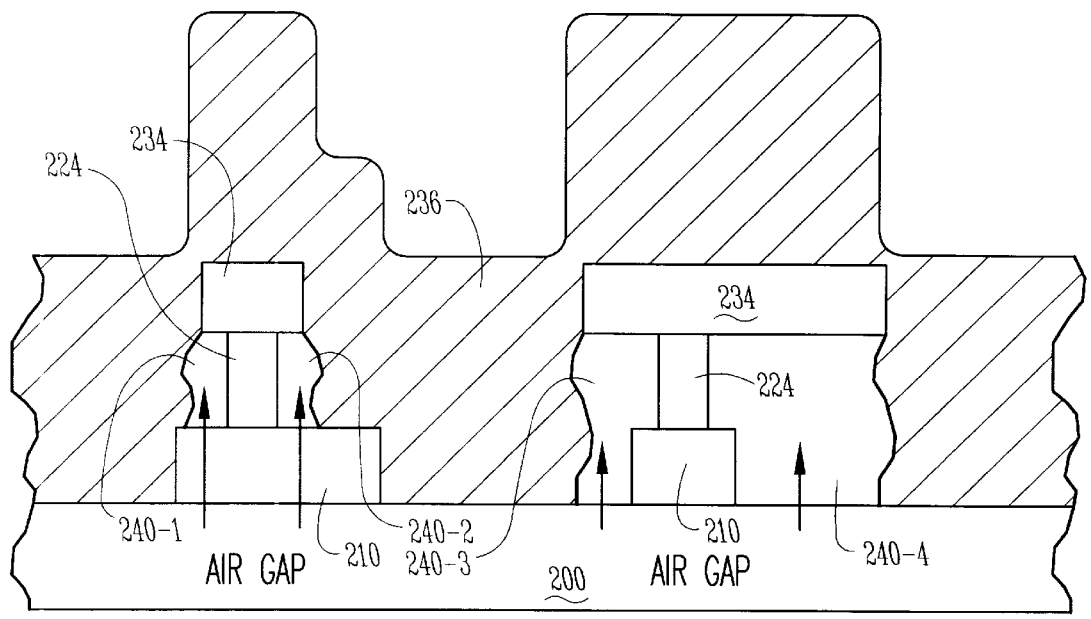

FIG. 2F illustrates the structure following the last and most important step in the fabrication process according to the teachings of the present invention. As shown in FIG. 2F, this step includes the formation of a low dielectric constant material, or low-k dielectric 236 and, at the same time, formation of air gaps 240-1, 240-2, . . . , 240-N. According to the teachings of the present invention, the low-k dielectric 236 is deposited between the number of metal lines, e.g. 210, 224, and 234, and the substrate 200 using a directional process in order to accommodate the concurrent formation of air gaps 240-1, 240-2, . . . , 240-N. In one embodiment, depositing a low dielectric constant material 236 and concurrently forming air gaps 240-1, 240-2, . . . , 240-N includes depositing a low dielectric constant material 236 having a dielectric constant (k) of less than 2.7. According to one embodiment of the present invention, a highly directional process is used to deposit a low-k polymer film 236. In the embodiment shown in FIG. 2F, the area under the multilayer metal lines, 210, 224, and 234, will become air gaps 240-1, 240-2, . . . , 240-N. In one embodiment, depositing a low dielectric constant material 236 between the number of metal lines 210, 224, and 234 and the substrate 200 includes using a highly directional deposition tool. In this embodiment, using a direction process includes using a microwave plasma-assisted supersonic jet deposition technique. An example of this technique for use in the present invention is described in U.S. Pat. No. 5,356,672, issued Oct. 18, 1994 to Schmitt et al., entitled "Method for microwave plasma assisted supersonic jet deposition of thin films". As one of ordinary skill in the art will understand upon reading this disclosure, the ordinary chemical vapor deposition (CVD) process may not be suitable for the present invention, since the conventional CVD process typically provides conformal deposition, which will not form the air gaps 240-1, 240-2, . . . , 240-N according to the teachings of the present invention.

The following descriptions illustrate, by way of example and not by way of limitation, that according to the teachings of the present invention, several polymer source materials can be used. In one embodiment, depositing a low dielectric constant material 236 includes depositing an organic silica film 236. In one example depositing a low dielectric constant material includes the deposition of an extremely low dielectric constant organic silica films 236 such as described in an article by Y. Uchida et al., entitled "A fluorinated Organic-Silica Film with Extremely Low Dielectric Constant," *Japan J. Appl. Phys.*, 38, no. 4B, p. 2368–2372 (1999). The same is incorporated herein by reference. This embodiment includes depositing a fluorinated organic-silica film 236 using a quasi hydrogen-free chemical vapor deposition process. In one embodiment, using a quasi hydrogen-free chemical vapor deposition process includes using a mixture of tetra-iso-cyanate silane, di-methyl silyl di-iso-cyanate silane, and tri-methyl amine by successive fluorination. In one embodiment, using a mixture of tetra-iso-cyanate silane, di-methyl silyl di-iso-cyanate silane, and tri-methyl amine by successive fluorination includes creating a film 236 in which a set of methyl groups and a flouring group of atoms are as much as 43% and 9% respectively of that for a content of silicon atoms in the film 236. Such a film 236 has good insulting characteristics and a dielectric constant (k) as low as 2.5. In one embodiment, the method further includes vacuum annealing this film 236. Vacuum annealing can improve the dielectric constant of this film to approximately k=2.1.

In another embodiment, according to the teachings of the present invention, depositing a low dielectric constant material 236 includes forming a low dielectric constant film by radio frequency plasma enhanced chemical vapor deposition using tetramethylsilane. One embodiment for performing the same is described in an article by A. Grill and V. Patel, entitled "Low dielectric constant films prepared by plasma-enhanced chemical vapor deposition from tetramethylsilane," *Journal of Applied Physics*, 85, no. 6, p. 3314–3318 (1999) which is incorporated herein by reference. In this embodiment, dielectric constants (k) as low as 3.1 can be obtained in annealed films.

In another embodiment, according to the teachings of the present invention, depositing a low dielectric constant material 236 includes forming a polymer-like organic thin film 236 between the number of metal lines, e.g. 210, 224, and 234, and the substrate 200 using a plasma enhanced CVD process using a para-xylene precursor. One embodiment for performing the same is described in an article by Y. C. Quan et al., entitled "Polymer-like Organic thin films Deposited by Plasma Enhanced Chemical Vapor Deposition Using the Para-xylene Precursor as Low dielectric constant Interlayer Dielectrics for Multilevel Metallization," *Japan J. Appl. Pys.*, 38, no. 3A, p. 1356–1358 (1999) which is incorporated herein by reference. According to this embodiment, as the plasma power is increased from 5 Watts (W) to 60 W, the relative dielectric constant (k) of this polymer-like organic thin film 236 increased from 2.7 to 3.21. However, the film 236 deposited at a higher plasma power showed higher thermal stability. The film 236 deposited at 60 W was stable up to 450° C., and all films 236 were insulating under an applied electric field up to as large as 1 MegaVolts/cm.

Again, as one of ordinary skill in the art will understand upon reading this disclosure, any one or combination of the above described methods are suitable for performing the methods of the present invention to create the novel multi-level wiring interconnect such that the structure includes a low dielectric constant material 236 and a number of air gaps 240-1, 240-2, . . . , 240-N formed between the number of metal lines, e.g. 210, 224, and 234, and the substrate 200. The same are not intended to limit the scope of the present invention. One of ordinary skill in the art will further understand upon reading this disclosure, that prior to the directional deposition of the low-k dielectric 236 the number of metal lines, e.g. 210, 224, and 234, can be exposed to a dilute silane at approximately 300 degrees Celsius to form a surface silicide as a passivation layer in order to prevent reaction of a copper metal line, e.g. 210, 224, and 234, and polymer film 236. One method for forming the same is described in an article by S. Hymes et al., entitled "Passivation of Copper by Silicide Formation in Dilute Silane," *MRS Conference Proceedings*, ULSI-VII, p. 425–431 (1992) which is incorporated herein by reference. Another method is described in a co-pending, co-filed and commonly assigned application Ser. No. 09/584,157, entitled "Multi-level Copper Interconnect with Double Insulation," which is incorporated by reference. One of ordinary skill in the art will understand upon reading this disclosure, that the choice of such a passivation layer is dependant in part upon the dielectric materials 236 used.

Any excess material on top of multilevel wiring interconnect of the present invention can be removed by etching, such as by chemical mechanical polishing (CMP) in order to provide a planarized, smooth surface for subsequent processing. As one of ordinary skill in the art will understand upon reading this disclosure, forming additional or subsequent layer/levels of conductive vias and metallization lines are also included within the scope of the present invention.

Figure 3:
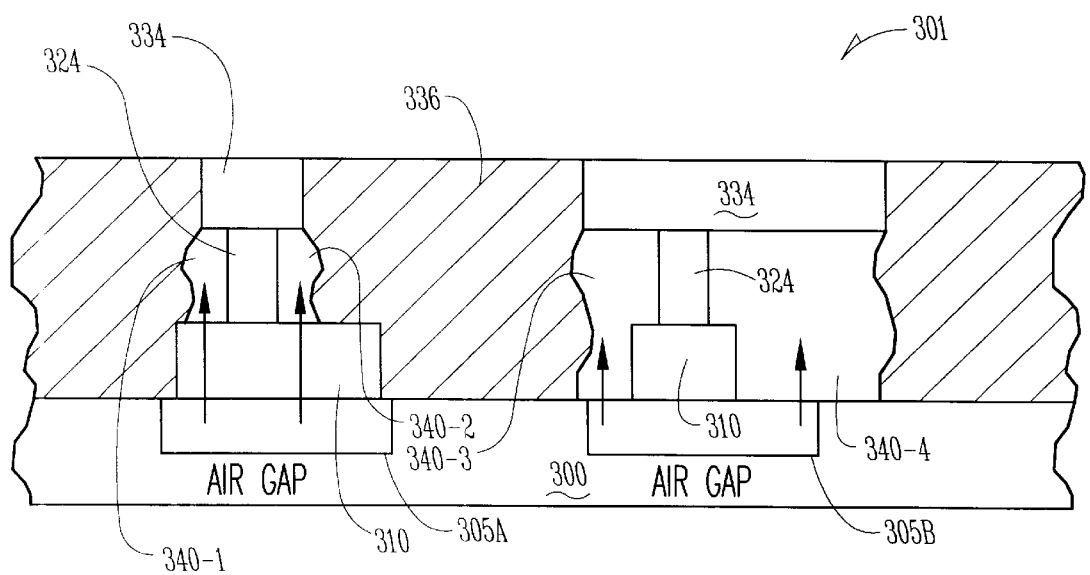
FIG. 3 is an illustration of an integrated circuit formed according to the teachings of the present invention.

FIG. 3 is an illustration of an integrated circuit 301 formed according to the teachings of the present invention. In one embodiment, integrated circuit 301 is part of an integrated memory circuit. As shown in FIG. 3, the integrated circuit 301 includes a multilevel wiring interconnect having a number of multilayer metal lines, e.g. 310, 324, and 334, connecting to a number of semiconductor devices, e.g. one or more transistors 305A and 305B, in a substrate 300. In one embodiment, the number of multilayer metal lines, e.g. 310, 324, and 334, in integrated circuit 301 includes a multilayer copper wiring structure. As shown in FIG. 3, the integrated circuit 301 includes a low dielectric constant insulator 336 in a number of interstices between the number of copper lines, 310, 324, and 334, and the substrate 300. Also, according to the teaching of the present invention, the integrated circuit includes a number of air gaps 340-1, 340-2, . . . , 340-N in the low dielectric constant insulator 336. The embodiment shown in FIG. 3, illustrates that a multilayer wiring interconnect which has been planarized, such as by a CMP process, to provide a planarized, smooth surface for subsequent processing.

Figure 4:
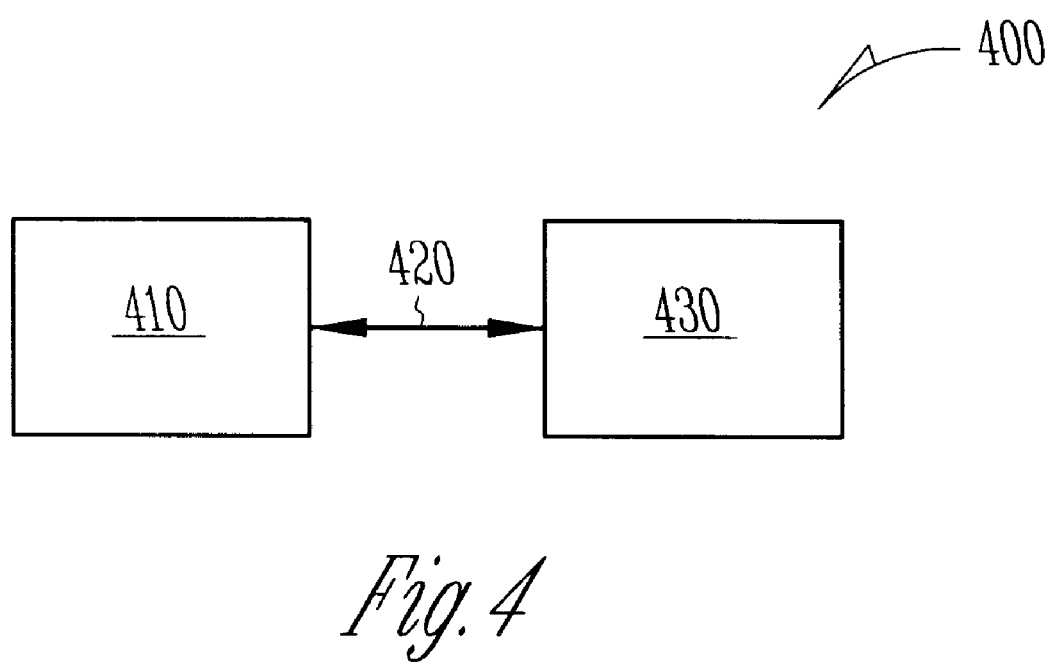
FIG. 4 illustrates a system having an integrated memory circuit and incorporating a multilevel wiring structure formed according to the teachings of the present invention.

FIG. 4 illustrates a system 400 having an integrated memory circuit 430 and incorporating a multilevel wiring structure formed according to the teachings of the present invention. As one of ordinary skill in the art will understand upon reading this disclosure, this system 400 includes a processor 410 and an integrated circuit, or integrated memory circuit 430 coupled to the processor 410. The processor 410 can be coupled to the integrated memory circuit 430 via any suitable bus 420, as the same are known and understood by one of ordinary skill in the art. In the embodiment, the processor 410 and integrated circuit 430 are located on a single wafer or die. Again, at least a portion of the integrated circuit 430 includes a multilevel wiring structure as disclosed in the various embodiments provided herein.

CONCLUSION

Thus, structures and methods have been shown which provide for a multilayer copper wiring structure by electroless, selectively deposited copper in a streamlined process which further reduces both intral-level line to line capacitance and the inter-level capacitance.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. The scope of the invention includes any other applications in which the above structures and fabrication methods are used. The scope of the invention should be determined with reference to the appended claims, along with the full scope of equivalents to which such claims are entitled.

What is claimed is:

1. A method for forming multilevel wiring interconnects in an integrated circuit assembly, comprising:

forming a number of multilayer metal lines separated by air gaps above a substrate;

depositing a low dielectric constant material between the number of metal lines and the substrate using a directional process; and wherein using a directional process includes maintaining a number of air gaps in the low dielectric constant ma to the multilayer metal lines.

2. The method of claim 1, wherein depositing a low dielectric constant material between the number of metal lines and the substrate using a directional process includes using a microwave plasma-assisted supersonic jet deposition process.

3. The method of claim 1, wherein depositing a low dielectric constant material includes depositing an organic silica film.

4. The method of claim 1, wherein depositing a low dielectric constant material between the number of metal lines and the substrate using a directional process includes using a quasi hydrogen-free chemical vapor deposition process.

5. The method of claim 1, wherein depositing a low dielectric constant material between the number of metal lines and the substrate using a directional process includes forming a low dielectric constant film by radio frequency plasma enhanced chemical vapor deposition using tetramethylsilane.

6. The method of claim 1, wherein depositing a low dielectric constant material between the number of metal lines and the substrate using a directional process includes depositing a polymer-like organic thin film by plasma-enhanced chemical vapor deposition using a para-xylene precursor.

7. A method for forming multilevel wiring interconnects in an integrated circuit assembly, comprising:

forming a number of multilayer metal lines separated by air gaps above a substrate;

depositing a low dielectric constant material, having a dielectric constant of less than 2.7, between the number of metal lines and the substrate using a directional process; and wherein using a directional process includes maintaining a number of air gaps in the low dielectric constant material adjacent to the multilayer metal lines.

8. The method of claim 7, wherein depositing a low dielectric constant material, having a dielectric constant of less than 2.7, between the number of metal lines and the substrate using a directional process includes using a microwave plasma-assisted supersonic jet deposition process.

9. The method of claim 7, wherein depositing a low dielectric constant material, having a dielectric constant of less than 2.7, includes depositing an organic silica film.

10. The method of claim 7, wherein depositing a low dielectric constant material, having a dielectric constant of less than 2.7, between the number of metal lines and the substrate using a directional process includes using a quasi hydrogen-free chemical vapor deposition process.

11. The method of claim 7, wherein depositing a low dielectric constant material, having a dielectric constant of less than 2.7, between the number of metal lines and the substrate using a directional process includes depositing a polymer-like organic thin film by plasma-enhance chemical vapor deposition using a para-xylene precursor.

12. A method for forming multilevel wiring interconnects in an integrated circuit assembly, comprising:

forming a number of multilayer metal lines separated by air gaps above a substrate;

depositing a low dielectric constant material between the number of metal lines and the substrate using a quasi hydrogen-free chemical vapor deposition process; and wherein using a quasi hydrogen-free chemical vapor deposition process includes maintaining a number of air gaps in the low dielectric constant material.

13. The method of claim 12, wherein using a quasi hydrogen-free chemical vapor deposition process includes using a mixture of tetra-iso-cyanate silane, di-methyl silyl di-iso-cyanate silane, and tri-methyl amine by successive fluorination.

14. The method of claim 13, wherein using a mixture of tetra-iso-cyanate silane, di-methyl silyl di-iso-cyanate silane, and tri-methyl amine by successive fluorination includes creating a film in which of a set of methyl groups and a fluorine group of atoms are as much as 43% and 9% respectively of that for a content of silicon atoms in the film.

15. The method of claim 13, wherein the method further includes vacuum annealing the film.

16. The method of claim 12, wherein depositing a low dielectric constant material includes depositing a low dielectric constant material which has a dielectric constant (k) of less than 2.7.

17. A method for forming multilevel wiring interconnects in an integrated circuit assembly, comprising:

depositing a first seed layer including a thin film of Palladium (Pd) or Copper (Cu) on a substrate;

depositing a first patterned photoresist layer, wherein depositing the first patterned photoresist layer defines a number of via holes above the first seed layer;

forming a first layer of copper using electroless plating, wherein forming the first layer of copper using electroless plating includes filling the number of via holes to a top surface of the first patterned photoresist layer;

depositing a second seed layer including a thin film of Palladium (Pd) Copper (Cu) on the first layer of copper and the top surface of the photoresist layer;

depositing a second patterned photoresist layer, wherein depositing the second patterned photoresist layer defines a number of conductor line openings above the second seed layer;

forming a second layer of copper using electroless plating, wherein depositing a second layer of copper using electroless plating includes filling the number of conductor line openings to a top surface of the second patterned photoresist layer;

removing the patterned photoresist layers using oxygen plasma ashing;

depositing a low dielectric constant material between the layers of copper and the substrate using a directional process; and wherein using a directional process includes maintaining a number of air gaps in the low dielectric constant material.

18. The method of claim 17, wherein depositing a seed layer includes depositing a seed layer having a thickness of less than 15 nanometers (nm).

19. The method of claim 17, wherein depositing a seed layer includes forming a discontinuous island structure on the substrate using a sputtering deposition technique.

20. The method of claim 17, wherein depositing a low dielectric constant material includes depositing a low dielectric constant material which has a dielectric constant (k) of less than 2.7.

21. The method of claim 17, wherein depositing a low dielectric constant material between the number of copper layers and the substrate using a directional process includes using a microwave plasma-assisted supersonic jet deposition process.

22. The method of claim 17, wherein depositing a low dielectric constant material includes depositing an organic silica film.

23. The method of claim 17, wherein depositing a low dielectric constant material between the number of copper layers and the substrate using a directional process includes using a quasi hydrogen-free chemical vapor deposition process.

24. The method of claim 17, wherein depositing a low dielectric constant material between the number of copper layers and the substrate using a directional process includes forming a low dielectric constant film by radio frequency plasma enhanced chemical vapor deposition using tetramethylsilane.

25. The method of claim 17, wherein depositing a low dielectric constant material between the number of copper layers and the substrate using a directional process includes depositing a polymer-like organic thin film by plasma-enhance chemical vapor deposition using a para-xylene precursor.

26. A method for forming a multilayer copper wiring structure, comprising:

depositing a first seed layer on a substrate;

patterning a first photoresist layer over the first seed layer to define a number of via holes opening to the first seed layer;

forming a first level of copper vias in the number of via holes using electroless plating;

depositing a second seed layer on the first level of copper vias and first photoresist layer;

patterning a second photoresist layer over the second seed layer to define a number of conductor line openings to the second seed layer;

forming a first level of conductor lines in the number of conductor line openings using electroless plating;

depositing a third seed layer on the first level of conductor lines and the second photoresist layer;

patterning a third photoresist layer over the third seed layer to define a number of via holes opening to the third seed layer; and forming a second level of copper vias in the number of via holes using electroless plating;

removing the patterned photoresist layers using oxygen plasma ashing;

depositing a low dielectric constant material between the layers of copper and the substrate using a directional process; and wherein using a directional process includes maintaining a number of air gaps in the low dielectric constant material.

27. The method of claim 26, wherein depositing a low dielectric constant material includes depositing a low dielectric constant material which has a dielectric constant (k) of less than 2.7.

28. The method of claim 26, wherein depositing a low dielectric constant material between the number of copper layers and the substrate using a directional process includes using a microwave plasma-assisted supersonic jet deposition process.

29. The method of claim 26, wherein depositing a low dielectric constant material includes depositing an organic silica film.

30. The method of claim 26, wherein depositing a low dielectric constant material between the number of copper layers and the substrate using a directional process includes using a quasi hydrogen-free chemical vapor deposition process.

31. The method of claim 26, wherein depositing a low dielectric constant material between the number of copper layers and the substrate using a directional process includes forming a low dielectric constant film by radio frequency plasma enhanced chemical vapor deposition using tetramethylsilane.

* * * * *

UNITED STATES PATENT AND TRADEMARK OFFICE
CERTIFICATE OF CORRECTION

PATENT NO. : 6,423,629 B1
DATED : July 23, 2002
INVENTOR(S) : Ahn et al.

It is certified that error appears in the above-identified patent and that said Letters Patent is hereby corrected as shown below:

Title page,
Insert -- [73] Assignee: Micron Technology, Inc., Boise, ID (US) --.
Item [56], OTHER PUBLICATIONS, "Quan, Y.C., et al., reference" delete "Phys" and insert -- Phys. --, therefor.

Column 2,
Line 8, delete "intral-level" and insert -- intra-level --, therefor.

Column 8,
Line 14, after "gaps" delete "a".

Column 9,
Line 36, delete "Pys." and insert -- Phys. --, therefor.

Column 10,
Line 56, delete "intral-level" and insert -- intra-level --, therefor.

Column 11,
Line 14, delete "ma" and insert -- material adjacent --, therefore.

Signed and Sealed this

Fourth Day of February, 2003

JAMES E. ROGAN
*Director of the United States Patent and Trademark Office*